(12) United States Patent
Chou

(10) Patent No.: US 8,981,259 B2
(45) Date of Patent: Mar. 17, 2015

(54) HEATING APPARATUS FOR HEATING ELECTRONIC COMPONENTS ON A PRINTED CIRCUIT BOARD IN LOW TEMPERATURE ENVIRONMENT

(75) Inventor: Chih-Sheng Chou, New Taipei (TW)

(73) Assignee: Mildef Crete Inc., New Taipei (TW)

( * ) Notice: Subject to any disclaimer, the term of this patent is extended or adjusted under 35 U.S.C. 154(b) by 309 days.

(21) Appl. No.: 13/556,265

(22) Filed: Jul. 24, 2012

(65) Prior Publication Data

US 2014/0027435 A1    Jan. 30, 2014

(51) Int. Cl.
| | |
|---|---|
| H05K 7/20 | (2006.01) |
| H05K 1/02 | (2006.01) |
| H05B 3/22 | (2006.01) |
| H05B 3/30 | (2006.01) |
| H05B 3/26 | (2006.01) |
| H01L 23/34 | (2006.01) |

(52) U.S. Cl.
CPC ............... H05K 1/0212 (2013.01); H05B 3/26 (2013.01); H01L 23/345 (2013.01)
USPC ........... 219/209; 219/530; 219/540; 219/543; 219/544

(58) Field of Classification Search
CPC .......... H01L 23/345; H05B 1/02; H05B 3/22; H05B 3/26; H05B 3/262; H05B 3/265; H05B 3/267; H05K 1/0212; H05K 2203/1115
See application file for complete search history.

(56) References Cited

U.S. PATENT DOCUMENTS

| | | | | |
|---|---|---|---|---|
| 3,289,046 | A | * | 11/1966 | Carr ............................... 361/772 |
| 3,395,265 | A | * | 7/1968 | Weir .............................. 219/209 |
| 5,010,233 | A | * | 4/1991 | Henschen et al. ............ 219/209 |
| 5,268,558 | A | * | 12/1993 | Youssef et al. ................ 219/209 |
| 5,645,123 | A | * | 7/1997 | Doi et al. ...................... 165/48.1 |
| 5,896,259 | A | * | 4/1999 | Farwell et al. .................. 361/78 |
| 6,031,729 | A | * | 2/2000 | Berkely et al. ................ 361/771 |
| 6,133,674 | A | * | 10/2000 | Fry ............................... 310/343 |
| 6,262,392 | B1 | * | 7/2001 | Morton et al. ................ 219/209 |
| 6,621,055 | B2 | * | 9/2003 | Weber et al. .................. 219/494 |

(Continued)

FOREIGN PATENT DOCUMENTS

| | | |
|---|---|---|
| EP | 0969591 A1 | 1/2000 |
| GB | 2330289 A | 4/1999 |
| WO | WO99/59387 A1 | 11/1999 |

OTHER PUBLICATIONS

European Search Report issued on Nov. 23, 2012.

*Primary Examiner* — Joseph M Pelham
(74) *Attorney, Agent, or Firm* — Chun-Ming Shih; HDLS IPR Services

(57) ABSTRACT

A heating apparatus for heating electronic components on a printed circuit board in low temperature environment includes a printed circuit board, a heating unit, a switch unit, a temperature-sensing unit, an electric power unit, and a control unit. The heating unit, the switch unit, the temperature-sensing unit, and the control unit are fixed connected to the printed circuit board and are electrically connected with the metal lines on the printed circuit board. The heat source is sent to the heat-conducting layer on the printed circuit board through the heat-conducting terminal after the switch unit is conducted by the control unit and the power is sent from the electric power unit to the heating unit. Then, the electronic components are heated with the heat source through the heat-conducting layer, so that the electronic components are in the working temperatures for starting up.

15 Claims, 3 Drawing Sheets

(56) References Cited

U.S. PATENT DOCUMENTS

| | | | |
|---|---|---|---|
| 7,821,346 B2* | 10/2010 | McCracken | 331/69 |
| 8,022,777 B2* | 9/2011 | Stolpman et al. | 331/70 |
| 8,546,904 B2* | 10/2013 | Chen et al. | 257/467 |
| 2002/0162829 A1* | 11/2002 | Weber et al. | 219/209 |
| 2004/0020687 A1* | 2/2004 | Moore | 174/254 |
| 2009/0051446 A1* | 2/2009 | McCracken | 331/69 |
| 2009/0133920 A1* | 5/2009 | Kim et al. | 174/266 |
| 2009/0219101 A1* | 9/2009 | Stolpman et al. | 331/70 |
| 2011/0233184 A1* | 9/2011 | Bouix et al. | 219/209 |
| 2012/0301204 A1* | 11/2012 | Bouix et al. | 401/2 |
| 2013/0015548 A1* | 1/2013 | Chen et al. | 257/467 |
| 2014/0226283 A1* | 8/2014 | Kim et al. | 361/720 |

* cited by examiner

HEATING APPARATUS FOR HEATING ELECTRONIC COMPONENTS ON A PRINTED CIRCUIT BOARD IN LOW TEMPERATURE ENVIRONMENT

BACKGROUND OF THE INVENTION

1. Field of the Invention

The present invention relates to a heating apparatus, and especially relates to a heating apparatus for heating electronic components on a printed circuit board in low temperature environment.

2. Description of Prior Art

An electronic apparatus includes at least one printed circuit board. Many electronic components with different specifications are mounted on the printed circuit board. The electronic components are connected to each other with copper foil metal lines on the printed circuit board to form an electronic apparatus with specific functions.

The electronic apparatuses will be sold to different areas or countries after the electronic apparatuses are manufactured. The working temperatures for the electronic components mounted on the printed circuit board are usually between 0° C. to 50° C., but environment temperatures in some areas or countries in winter are between −20° C. to −30° C. Therefore, the electronic apparatuses can't be used because many of the electronic components mounted on the printed circuit board are too cold to be started up.

In order to solve the above-mentioned problems, the printed circuit board or the electronic components mounted on the printed circuit board will be covered with a heating sheet. The heating sheet will be started up first when the electronic apparatus is powered on. The printed circuit board or the electronic components mounted on the printed circuit board will be heated with the heat vortex generated from the heating sheet, so that the temperature is proper for the electronic components to be started up. After that, the heating sheet will be stopped heating, and the electronic components will be started up, so that the electronic apparatus can be properly started up.

Although the electronic components mounted on the printed circuit board will be heated with the heat vortex mentioned above, the heating rate is slow so that some electronic components are not heated completely. Then, the electronic device will not be started up successfully or will be started up slowly.

SUMMARY OF THE INVENTION

In order to solve the above-mentioned problems, an object of the present invention is to provide a heating apparatus for heating electronic components on a printed circuit board in low temperature environment.

In order to achieve the object of the present invention mentioned above, the heating apparatus of the present invention heats the electronic components mounted on the printed circuit board. The heating apparatus includes a printed circuit board and at least a heating unit. A plurality of metal lines which connect the electronic components, and a heat-conducting layer under the electronic components, are on the printed circuit board. The heating unit is arranged on the printed circuit board, and connected to the metal lines and the heat-conducting layer. The heat source is transmitted to the heat-conducting layer after the heating unit is started to heat. The electronic components are heated with the heat source through the heat-conducting layer, so that the electronic components are in the working temperatures for starting.

Moreover, plural electrical contacts are at the terminals of the metal lines. The metal lines are copper foils. The heat-conducting layer is a copper foil. The heating unit includes a plurality of conductive pins and a heat-conducting terminal. The conductive pins are electrically and fixedly connected to the electrical contacts of the metal lines. The heat-conducting terminal is fixed connected to the heat-conducting layer. The heating unit is a power resistor.

Moreover, the heating apparatus further includes a switch unit. The switch unit is arranged on the printed circuit board and electrically connected to the heating unit. The switch unit is a metal oxide semiconductor field effect transistor (MOSFET).

Moreover, the heating apparatus further includes a control unit. The control unit is arranged on the printed circuit board and electrically connected to the switch unit. The switch unit is controlled by the control unit. The control unit is electrically connected to the electronic components. The electronic components are started up by the control unit when the temperatures of the electronic components are in the working temperatures for starting up. The control unit is a microprocessor.

Moreover, the heating apparatus further includes an electric power unit. The electric power unit is arranged on the printed circuit board and electrically connected to the switch unit.

Moreover, the heating apparatus further includes at least a temperature-sensing unit. The temperature-sensing unit is arranged on the printed circuit board and adjacent to the electronic components, and electrically connected to the metal lines and the control unit, to sense the temperatures of the electronic components to inform the control unit.

Moreover, the heating apparatus further includes a micro-processing unit. The micro-processing unit is electrically connected to the control unit. Each of the electronic components is started up by the micro-processing unit which is informed by the control unit when the temperatures of the electronic components are in the working temperatures for starting up.

Moreover, the printed circuit board is a multi-layer printed circuit board. The multi-layer printed circuit board includes a first insulation layer, a bottom circuit layer, an electric power circuit layer, a second insulation layer, a grounding circuit layer, a third insulation layer, and a top circuit layer. The bottom circuit layer (includes the heat-conducting layer) is under the first insulation layer. The electric power circuit layer is above the first insulation layer. The second insulation layer is above the electric power circuit layer. The grounding circuit layer is above the second insulation layer. The third insulation layer is above the grounding circuit layer. The top circuit layer (includes the heat-conducting layer) is above the third insulation layer.

Moreover, the heating unit, the switch unit, the temperature-sensing unit, the electric power unit, and the control unit are electrically and fixedly connected to the bottom circuit layer or the top circuit layer, and then electrically connected to the electric power circuit layer and the grounding circuit layer.

DETAILED DESCRIPTION OF THE INVENTION

Figure 1:
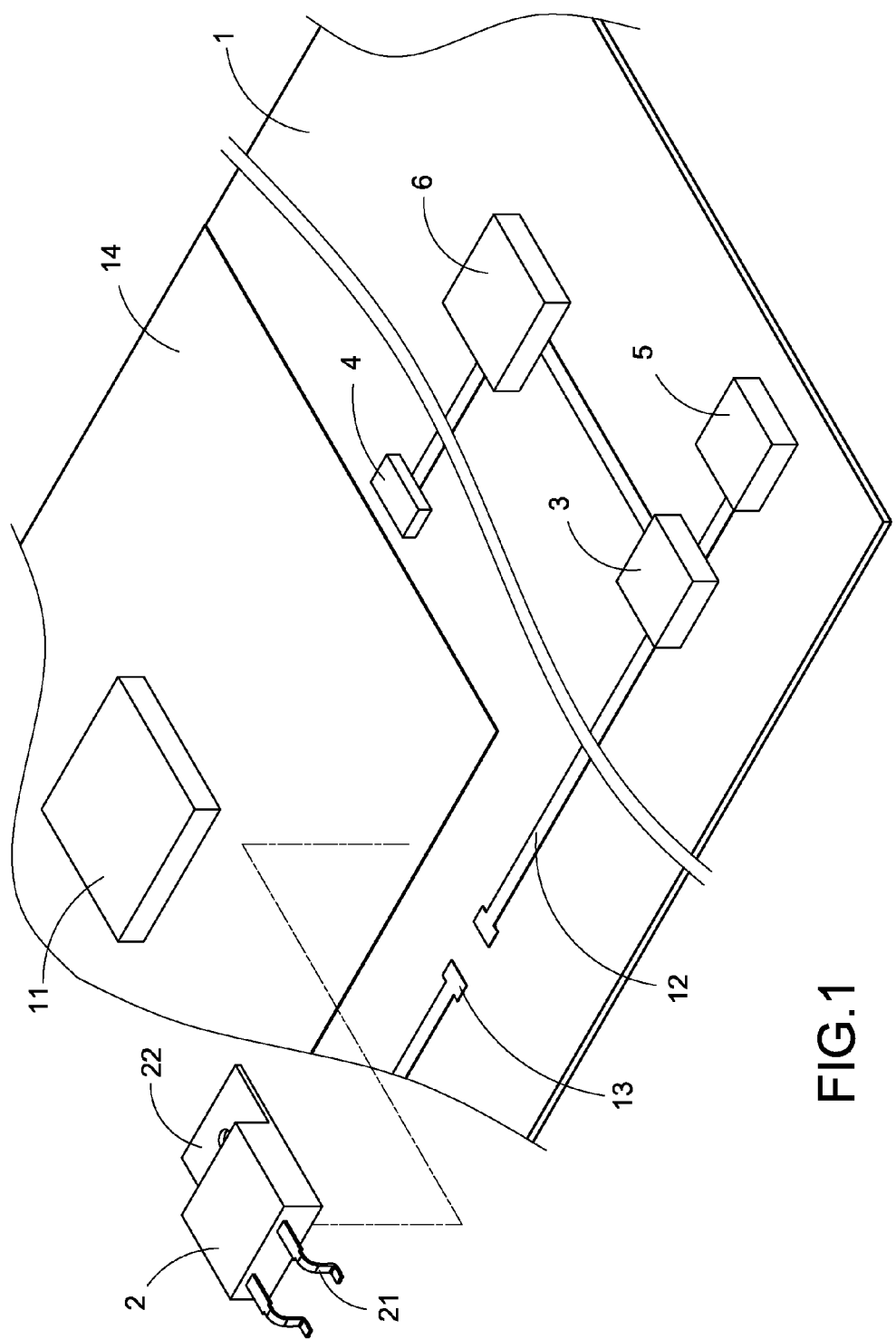
FIG. 1 shows a decomposition diagram of the heating apparatus of the present invention.
Figure 2:
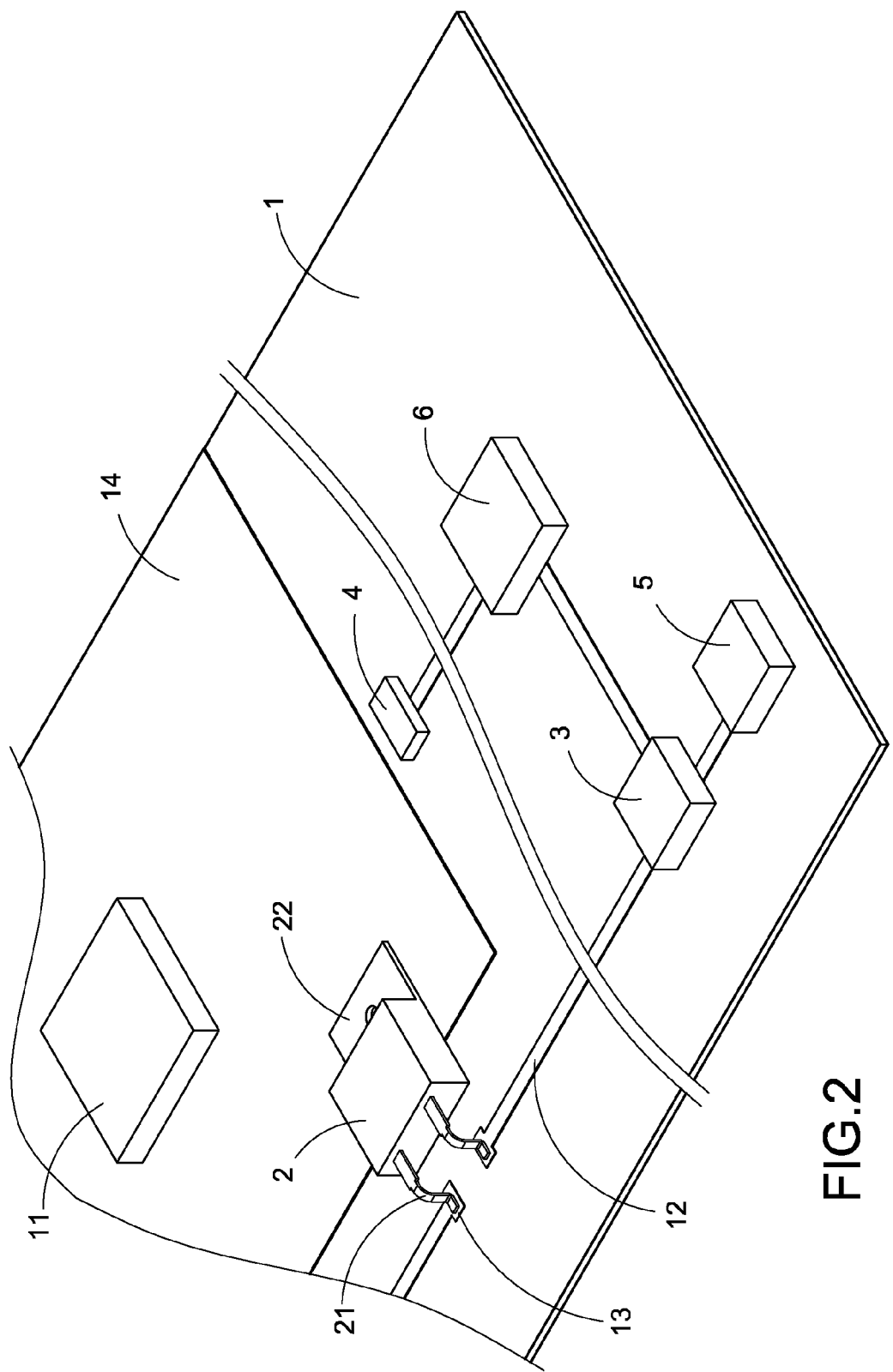
FIG. 2 shows an appearance diagram of the heating apparatus of the present invention.

FIG. 1 shows a decomposition diagram of the heating apparatus of the present invention. FIG. 2 shows an appearance diagram of the heating apparatus of the present invention. The heating apparatus of the present invention includes a printed circuit board 1, a heating unit 2, a switch unit 3, a temperature-sensing unit 4, an electric power unit 5, and a control unit 6.

The printed circuit board 1 is a glass fiber board. A plurality of electronic components 11 and a plurality of metal lines which connect the electronic components are mounted on the printed circuit board 1. A plurality of electrical contacts 13 are arranged at the terminals of the metal lines 12. A heat-conducting layer 14 with large area is provided on the printed circuit board 1 and under the electronic components 11 (or electrically and fixedly connected to the electronic components 11). The metal lines 12 are copper foils. The heat-conducting layer 14 is a copper foil.

The plural heating units 2 (or single heating unit 2) are fixedly connected to the printed circuit board 1. The heating unit 2 includes a plurality of conductive pins 21 and a heat-conducting terminal 22. The conductive pins 21 are electrically and fixedly connected to the electrical contacts 13 of the metal lines 12 with surface mounted technology. The heat-conducting terminal 22 is fixed connected to the heat-conducting terminal 22. The heat source is transmitted to the heat-conducting layer 14 after the heating unit 2 is started to heat. The electronic components 11 are heated with the heat source through the heat-conducting layer 14, so that the electronic components 11 are in the working temperatures for starting up. The heating unit 2 is a power resistor. The heat source is generated by the power resistor after voltage is applied.

The switch unit 3 is fixedly connected to the printed circuit board 1 and electrically connected to the heating unit 2 and the control unit 6 with the metal lines 12. The electric power is sent from the electric power unit 5 to the heating unit 2 after the switch unit 3 is controlled by the control unit 6. The switch unit 3 is a metal oxide semiconductor field effect transistor (MOSFET).

The plural temperature-sensing units 4 (or single temperature-sensing unit 4) are fixedly connected to the metal line 12 on the printed circuit board 1. The temperature-sensing unit 4 is adjacent to or in contact with the electronic components 11 or the heat-conducting layer 14. The temperature-sensing unit 4 is electrically connected to the control unit 6 through the metal line 12 and senses the temperatures of the electronic components 11 or the heat-conducting layer 14.

The electric power unit 5 is fixedly connected to the printed circuit board 1 and electrically connected to the switch unit 3 with the metal line 12. The electric power is provided from the electric power unit 5 to the heating unit 2 after the switch unit 3 is conducted. The electric power unit 5 is a direct current power source.

The control unit 6 is fixedly connected to the printed circuit board 1 and electrically connected to the switch unit 3 and the temperature-sensing unit 4 with the metal line 12. The electric power is sent from the electric power unit 5 to the heating unit 2 after the switch unit 3 is controlled by the control unit 6. Each of the electronic components 11 is heated with the heat source sent from the heating unit 2 to the heat-conducting layer 14, so that each of the electronic components 11 will be started up in low temperature environment. The control unit 6 is a microprocessor.

Please refer to FIG. 1 and FIG. 2 again. In industry standard, the working temperatures (low temperature limitation) of the electronic components 11 are between −20° C. to −50° C. Besides, the working temperatures (low temperature limitation) of the control unit 6 and the heating unit 2 are between −40° C. to −60° C.

The switch unit 3 is controlled by the control unit 6 through the metal line 12 and is conducted before an electronic apparatus (not show in FIG. 1 or FIG. 2) is started in low temperature environment. The direct current power source is sent from the electric power unit 5 to the heating unit 2 through the switch unit 3. The electronic components 11 will be heated with the heat vortex generated by the heating unit 2. The heat source generated by the heating unit 2 is sent to the heat-conducting layer 14 (copper foil) on the printed circuit board 1 through the heat-conducting terminal 22. Then, the electronic components 11 are heated with the heat source through the heat-conducting layer 14, so that the electronic components are in the working temperatures for starting up.

When each of the electronic components 11 is in working temperature and then the working temperature is detected by the temperature-sensing unit 4, the temperature-sensing unit 4 will inform the control unit 6 to control the switch unit 3 to be in cut-off status, so that power sent from the electric power unit 5 will not be sent to the heating unit 2 and the heating unit 2 will stop heating. Then, each of the electronic components 11 will be started up by the control unit 6, or another micro-processing unit (not show in FIG. 1 or FIG. 2) will be informed by the control unit 6 to start up each of the electronic components 11, so that the electronic apparatus is started up.

Figure 3:
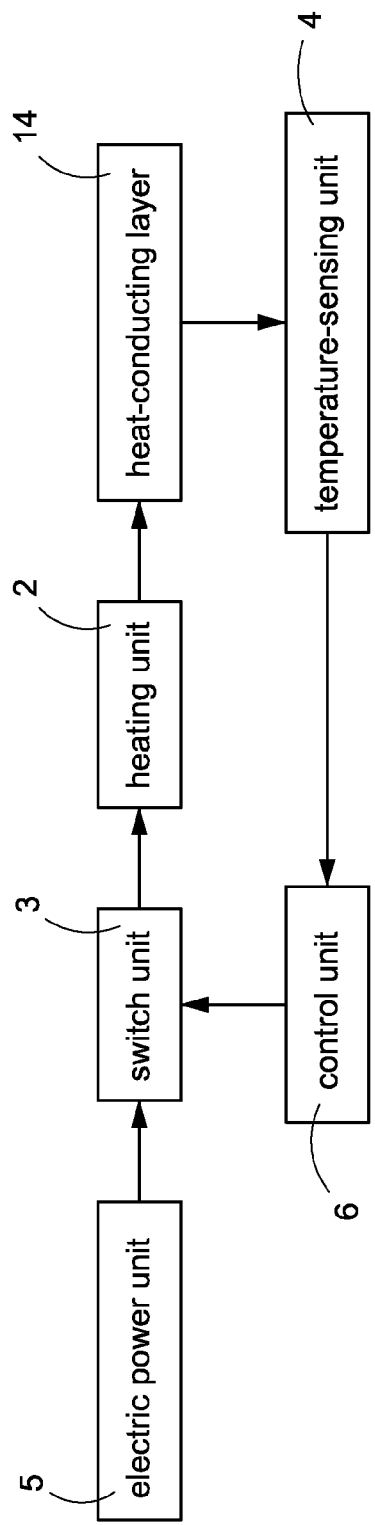
FIG. 3 shows a block diagram of the heating apparatus of the present invention.

FIG. 3 shows a block diagram of the heating apparatus of the present invention. The switch unit 3 is controlled by the control unit 6 to be conducted before an electronic apparatus (not shown in FIG. 3) is started up in low temperature environment. The direct current power source is sent from the electric power unit 5 to the heating unit 2 through the switch unit 3, so that the heating unit 2 will heat. The heat source generated by the heating unit 2 is sent to the heat-conducting layer 14 on the printed circuit board 1 through the heat-conducting terminal 22 (not shown in FIG. 3). The electronic components 11 will be heated by the heat-conducting layer 14. When the electronic components 11 are in working temperatures and then the working temperatures are detected by the temperature-sensing unit 4, the temperature-sensing unit 4 will inform the control unit 6 to control the switch unit 3 to be in cut-off status, so that power sent from the electric power unit 5 will not be sent to the heating unit 2 and the heating unit 2 will stop heating.

Then, each of the electronic components 11 will be started up by the control unit 6, or another micro-processing unit will be informed by the control unit 6 to start up each of the electronic components 11, so that the electronic apparatus is started up.

Figure 4:
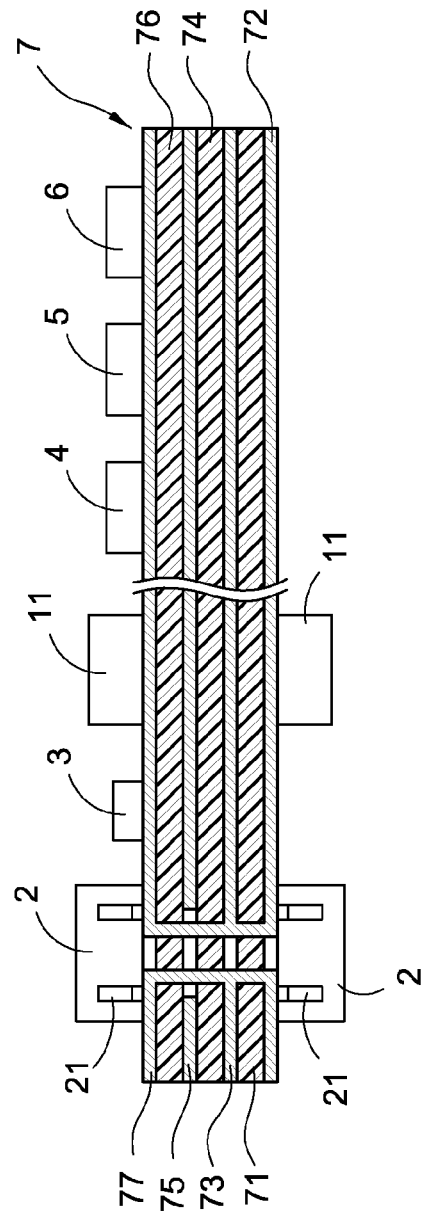
FIG. 4 shows a diagram of another embodiment of the present invention.

FIG. 4 shows a diagram of another embodiment of the present invention. A multi-layer printed circuit board 7 includes a first insulation layer 71, a bottom circuit layer 72, an electric power circuit layer 73, a second insulation layer 74, a grounding circuit layer 75, a third insulation layer 76, and a top circuit layer 77. The bottom circuit layer 72 (includes the heat-conducting layer) is under the first insulation layer 71. The electric power circuit layer 73 is above the first insulation layer 71. The second insulation layer 74 is above the electric power circuit layer 73. The grounding circuit layer 75 is above the second insulation layer 74. The third insulation layer 76 is above the grounding circuit layer 75. The top circuit layer 77 (includes the heat-conducting layer) is above the third insulation layer 76.

After the heating unit 2, the switch unit 3, the temperature-sensing unit 4, the electric power unit 5, and the control unit 6 are electrically and fixedly connected to the bottom circuit layer 72 or the top circuit layer 77, and then electrically connected to the electric power circuit layer 73 and the grounding circuit layer 75, the electronic components 11, which are on the bottom circuit layer 72 and top circuit layer 77, are heated with the heat source (the heat source is generated by the heating unit 2 and is sent through the heat-conducting layer of the bottom circuit layer 72 and the heat-conducting layer of the top circuit layer 77). When the electronic components 11 are in working temperatures and then the working temperatures are detected by the temperature-sensing unit 4, the temperature-sensing unit 4 will inform the control unit 6 to control the switch unit 3 to be in cut-off status, so that power sent from the electric power unit 5 will not be sent to the heating unit 2 and the heating unit 2 will stop heating.

Then, each of the electronic components 11 will be started up by the control unit 6, or another micro-processing unit (not show in FIG. 4) will be informed by the control unit 6 to start up each of the electronic components 11, so that the electronic apparatus is started up.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A heating apparatus for heating electronic components (11) on a printed circuit board (1) in low temperature environment, the heating apparatus heating a plurality of electronic components (11) mounted on the printed circuit board (1), the heating apparatus including:
   a printed circuit board (1) comprising a plurality of metal lines (12) connecting the electronic components (11), and comprising a heat-conducting layer (14) under the electronic components (11); and
   a heating unit (2) arranged on the printed circuit board (1) and connected to the metal lines (12) and the heat-conducting layer (14),
   wherein heat is transmitted from the heating unit (2) to the heat-conducting layer (14) after the heating unit (2) is started to heat; the electronic components (11) are heated with the heat source through the heat-conducting layer (14), so that the electronic components (11) are in the working temperatures for starting up,
   wherein the printed circuit board (1) is a multi-layer printed circuit board (7), and
   wherein the multi-layer printed circuit board (7) includes a first insulation layer (71), a bottom circuit layer (72), an electric power circuit layer (73), a second insulation layer (74), a grounding circuit layer (75), a third insulation layer (76), and a top circuit layer (77), wherein the bottom circuit layer (72) includes the heat-conducting layer (14); the bottom circuit layer (72) is under the first insulation layer 71; the electric power circuit layer (73) is above the first insulation layer (71); the second insulation layer (74) is above the electric power circuit layer (73); the grounding circuit layer (75) is above the second insulation layer (74); the third insulation layer (76) is above the grounding circuit layer (75); the top circuit layer (77) includes the heat-conducting layer (14); the top circuit layer (77) is above the third insulation layer (76).

2. The heating apparatus in claim 1, wherein a plurality of electrical contacts (13) are arranged at the terminals of the metal lines (12).

3. The heating apparatus in claim 2, wherein the metal lines (12) are copper foils.

4. The heating apparatus in claim 3, wherein the heat-conducting layer (14) is a copper foil.

5. The heating apparatus in claim 4, wherein the heating unit (2) includes a plurality of conductive pins and a heat-conducting terminal (22); the conductive pins (21) are electrically and fixedly connected to the electrical contacts (13); the heat-conducting terminal (22) is fixed connected to the heat-conducting layer (14).

6. The heating apparatus in claim 5, wherein the heating unit (2) is a power resistor.

7. The heating apparatus in claim 6, further including a switch unit (3) arranged on the printed circuit board (1) and electrically connected to the heating unit (2).

8. The heating apparatus in claim 7, wherein the switch unit (3) is a metal oxide semiconductor field effect transistor (MOSFET).

9. The heating apparatus in claim 8, further including a control unit (6), wherein the control unit (6) is arranged on the printed circuit board (1) and is electrically connected to the switch unit (3); the switch unit (3) is controlled by the control unit (6).

10. The heating apparatus in claim 9, wherein the control unit (6) is electrically connected to the electronic components (11); the electronic components (11) are started up by the control unit (6) when the electronic components (11) are in the working temperatures for starting up.

11. The heating apparatus in claim 10, wherein the control unit (6) is a microprocessor.

12. The heating apparatus in claim 11, further including an electric power unit (5) arranged on the printed circuit board (1) and electrically connected to the switch unit (3).

13. The heating apparatus in claim 12, further including at least a temperature-sensing unit (4), wherein the temperature-sensing unit (4) is arranged on the printed circuit board (1) and adjacent to the electronic components (11), and electrically connected to the metal lines (12) and the control unit (6), to sense the temperatures of the electronic components (11) to inform the control unit (6).

14. The heating apparatus in claim 13, further including a micro-processing unit, wherein the micro-processing unit is electrically connected to the control unit (6); each of the electronic components (11) is started up by the micro-processing unit informed by the control unit (6) when the electronic components (11) are in the working temperatures for starting up.

15. The heating apparatus in claim 1, wherein the heating unit (2), the switch unit (3), the temperature-sensing unit (4), the electric power unit (5), and the control unit (6) are electrically and fixedly connected to the bottom circuit layer (72) or the top circuit layer (77), and then electrically connected to the electric power circuit layer (73) and the grounding circuit layer (75).

* * * * *